United States Patent [19]

Kinouchi et al.

[11] Patent Number: 5,467,088
[45] Date of Patent: Nov. 14, 1995

[54] HUFFMAN CODE DECODING CIRCUIT

[75] Inventors: Shigenori Kinouchi; Akira Sawada, both of Tokyo, Japan

[73] Assignee: NEC Corporation, Tokyo, Japan

[21] Appl. No.: 135,448

[22] Filed: Oct. 13, 1993

[30] Foreign Application Priority Data

Oct. 13, 1992 [JP] Japan .................................. 4-273925
Oct. 27, 1992 [JP] Japan .................................. 4-288029

[51] Int. Cl.$^6$ ..................................................... H03M 7/40
[52] U.S. Cl. ......................................................... 341/65
[58] Field of Search .................................... 341/65, 67, 95

[56] References Cited

U.S. PATENT DOCUMENTS 5,208,593  5/1993  Tong et al. ................................ 341/65

Primary Examiner—Brian K. Young
Attorney, Agent, or Firm—Sughrue, Mion, Zinn, Macpeak & Seas

[57] ABSTRACT

A huffman code decoding circuit has a memory storing a decoded word and a code length or a pointer to be accessed in the next time determined on the basis of a state transition upon decoding of a bit variable length code per every one or n bits and a flag representative of the decoding condition of the code and outputting the decoded word and the code length or the pointer for next access and the flag corresponding to an access address of m bits. A latching circuit latches the pointer of m−1 bit output from the memory when the flag is indicative of continuation of decoding, and is reset when the flag output from the memory is indicative of completion of decoding. A selector selectively outputs n−1 bit from one of the latching circuit and the bit variable length code to the memory, according to selection for decoding of the bit variable length code per every 1 bit or every n bit.

10 Claims, 10 Drawing Sheets

FIG.2

| ADDRESS<br>8 7 6 5 4 3 2 1 0 | MEMORY<br>0F 7 6 5 4 3 2 1 0 (9TH BIT IS FLAG) |
|---|---|
| 0 0 0 0 0 1 0 1 0 | 1 DECODED WORD A, CODE LENGTH 4 |

FIG.3

| 8 7 6 5 4 3 2 1 0 | 0F 7 6 5 4 3 2 1 0 (9TH BIT IS FLAG) | | |
|---|---|---|---|
| 0 0 0 0 0 1 0 1 1 | 0 0 0 0 0 1 0 0 0 | 0 0 0 0 0 1 0 0 0 | |
| 0 0 0 0 0 1 1 0 0 0 | 0 0 0 0 1 0 0 0 0 | | |
| 0 0 0 1 0 x x 1 0 | 1 DECODED WORD C, CODE LENGTH 10 | | |

FIG.4

| ADDRESS<br>8 7 6 5 4 3 2 1 0 | MEMORY<br>8 7 6 5 4 3 2 1 0 (9TH BIT IS FLAG) |
|---|---|
| 0 0 0 0 0 0 0 0 0 | 0 0 0 0 0 0 0 0 1 |
| 0 0 0 0 0 0 0 1 1 | 0 0 0 0 0 0 0 1 0 |
| 0 0 0 0 0 0 1 0 0 | 0 0 0 0 0 0 0 1 1 |
| 0 0 0 0 0 0 1 1 1 | 1 DECODED WORD A, CODE LENGTH 4 |

FIG.6

| 9 8 7 6 5 4 3 2 1 0 | 7 6 5 4 3 2 1 0 | 4 3 2 1 0 (5TH BIT IS FLAG) |
|---|---|---|
| x x x x 1 0 1 0 1 0 | DECODED WORD D | 1 CODE LENGTH 6 |

FIG.7

| 9 8 7 6 5 4 3 2 1 0 | 7 6 5 4 3 2 1 0 | 4 3 2 1 0 (5TH BIT IS FLAG) |
|---|---|---|
| 0 0 0 0 0 0 0 0 1 1 | 0 0 0 0 0 0 0 1 | 0 x x x x |
| 0 0 0 0 0 0 0 1 1 1 | 0 0 0 0 0 0 1 0 | 0 x x x x |
| 0 0 0 0 0 0 1 0 0 1 | 0 0 0 0 0 0 1 1 | 0 x x x x |
| 0 0 0 0 0 0 1 1 0 1 | 0 0 0 0 0 1 0 0 | 0 x x x x |
| 0 0 0 0 0 1 0 0 0 0 | 0 0 0 0 0 1 0 1 | 0 x x x x |
| 0 0 0 0 0 1 0 1 x 1 | DECODED WORD B | 1 CODE LENGTH 11 |

5,467,088

HUFFMAN CODE DECODING CIRCUIT

BACKGROUND OF THE INVENTION

1. Field of the Invention

The present invention relates to a Huffman code decoding circuit for decoding a huffman code. More specifically, the invention relates to a Huffman code decoding circuit to be used for data compression in an image compression processing system or so forth and is capable of realizing improvement for decoding process speed and integration.

2. Description of the Related Art

Conventional huffman code decoding circuit employs a memory having an address for a maximum code address or a circuit for tracking a decoding tree for each bit in order to attribute a decoded word corresponding to the Huffman code.

FIG. 11 is a block diagram showing another conventional Huffman code. As shown in FIG. 11, the decoding circuit performs decoding process by tracking a decoding tree for each bit. The decoding circuit has a latch 210 and an internal memory 211. The internal memory 211 is of construction of 512 W×9 bits. In the internal memory 211, a leading one bit of a Huffman code data sequence is input as a least significant address, and 8 bits of an output of the latch circuit 210 is also input as upper 8 bits of the address.

On the other hand, the latch circuit 210 latches a pointer when the pointer is output from the internal memory 211. Among 9 bits of the output of the internal memory 211, 8 bit expresses a decoded word or the pointer, and remaining one bit is "1" if the output is the decoded word and "0" if the output is the pointer.

In the operation of the decoding circuit set forth above, at first, a memory address is determined based on 1 bit input from the Huffman code data sequence to obtain the output of the internal memory 211. When the output result is the pointer, the internal memory 211 is again accessed based on the pointer and the next 1 bit of the Huffman code data sequence. When the output is the decoded word, one cycle of decoding process is finished.

Such circuit to perform decoding by tracking the decoding tree for each bit, memory access for the times corresponding to number of code bits to lower decoding process speed.

A further example of the Huffman code decoding circuit, in which the decoding process speed is improved, is illustrated in FIG. 12. As shown in FIG. 12, the shown Huffman code decoding circuit has a memory 219 having address with a length corresponding to the maximum code length. This memory 219 has a construction of 64 kW×13 bits. Namely, the Huffman code data sequence is input to an address input of the memory 219. Then, a decoded word and a code length are obtained as the output of the memory 219 corresponding to the address. Here, assuming that the maximum code length is 16 bits and the decoded word is 8 bits, the 8 bits of the decoded word and 5 bits code length. For instance, the decoded word for "all of addresses "01010 . . . 0"~"01011 . . . 1" A and the code length "4" are set. Similarly, for each address is set with respect to the Huffman code for each decoded word.

In the Huffman code decoding circuit, at first, 16 bits from the leading bit of the Huffman code data sequence is input to the address in the memory 219. Assuming that "0101 . . . " is transmitted, "0101 . . . ", "0101" is input to the 4 upper bits of the memory 219, and a Huffman code is input to the 12 lower bits. As set forth above, since the decoded word "A" and the code length "4" are set are set in respective addresses "01010 . . . 0"~"01011 . . . 1", the decoded word "A" and the code length "4" can be derived. With the code length "4", the leading bit of the Huffman code and 16 bits is determined and then the 16 bits are input to the address of the memory 219. In the similar manner, decoding process is repeated.

In such decoding circuit, the process speed may be improved. However, assuming that the maximum code length is 16 bits, it requires the memory size to be 65536 W. Therefore, when it is caused to causes increasing of the area and cost.

On the other hand, as a still further example of the conventional Huffman code decoding circuit, in which a method for providing a plurality of memory for accessing simultaneously and selecting the decoded word is employed. The construction of this type of the Huffman code decoding circuit is illustrated in FIG. 13. The shown decoding circuit includes a memory 301~309 taking the leading 15 bits so that 14th~8th bits, 13th~7th bits, 12th~6th bits, 11th~5th, 10th~4th bits, 9th~3rd bits, 8th~2nd bits, 7th~1st bits and 7th~0th being taken as address inputs relative to the 16 bits of 15th~0th bits. a selector 401, and a select signal generating circuit 402 for controlling the selector 401.

This circuit utilizes the fact that when number of word of the Huffman code is less than or equal to 256 words, and when "0" is present in the data sequence of the code, number of bits following the relevant bit is less than or equal to 7 bits.

At first, respective 8 bits decoded words and 4 bits code length are set in memories 301~309. The memory 301 is set the decoded word and the code length in the case of the decoded word representative of the Huffman code having "0" in the leading bit. For instance, if the Huffman code corresponding to the decoded word "A" is "0001", the decoded word "A" and the code length "4" are set for all of addresses "00100000"~"00111111" of the memory 301.

Similarly, the memory 302 is set the decoded word and the code length in the case of the decoded word representative of the Huffman code having "0" in the second leading bit. For instance, if the Huffman code corresponding to the decoded word "B" is "10011", the decoded word "B" and the code length "5" are set for all of addresses "01100000"~"01111111" of the memory 302. Subsequently, in the similar manner, when a pattern of the data sequence is a sequence, in which "0" is added for the trailing end of a sequence of "1" containing i (integer) −1 in number of "1", the decoded word and the code length are set in the first memory. On the other hand, all of the leading 8 bits are "1", i.e. "11111111", the decoded word and the code length are set for the memory 309.

The operation will be discussed hereinafter. Among 16 bits Huffman code data sequence, 7 bits from the 14th bit as the second leading bit to the 8th bits as the second leading bits are stored in the first memory 301, the 13th bits~6th bits as the leading third bits are stored in the memory 302. Subsequently, in the same manner, up to the seventh memory 308, 7 bits which is t-th bit from the leading bit is stored in t−1-th memory. Lower 8 bits, i.e. 7th~0th bits are stored in the memory 309. At the same time, 16 bits are supplied to a select signal generating portion 402.

Here, consideration is given for the case where the Huffman code data sequence "0001 . . . " is input. Then, "001" is input to the upper 3 bits of the address of the memory 301. Since the memory 301 is set the decoded word "A" and the code length "4" for all addresses of "00100000"~"00111111", the decoded word "A" and the code length "4" are output in response to the above-mentioned Huffman code. With respect to other memories 302–309, the decoded words and the code length corresponding to the above-mentioned address input are output. The outputs of these memories 301–309 are input to inputs 0–8 of the selector 401.

The select signal generating portion 402 feeds a select signal for selecting the output of the memory 301 to the selector 401 when the leading bit, i.e. 15th bit of the data sequence is "0". On the other hand, when the pattern of the data sequence is that "0" is added the trailing end of i–1 of series of "1", the select signal generating portion 403 feeds the select signal to the selector for selecting the first memory. For instance, when the above-mentioned pattern is "10", since i=2, the signal selecting the 2nd memory (i=2) 302 is fed. On the other hand, in case of the pattern having "1" in all bits, the signal selecting the 9th memory (i=9) 309 us fed to the selector.

The code length "4" of the 1st memory 301 output from the selector 401 us fed to the Huffman code data sequence. Thus, the leading end of the next Huffman code data sequence is determined. Subsequently, the decoding process is performed in the similar manner.

In case of the above-mentioned example, 128 words×12 bits×8 (memories 301~308)+256 words×12 bits×1 (memory 309)=1280 words×12 bits. In the decoding circuit constructed as set forth above, a plurality of memories are required to require greater chip area that a single memory of the same capacity, and expensive.

SUMMARY OF THE INVENTION

Therefore, it is a first object of the present invention to provide a Huffman code decoding circuit eliminating the defects in the prior art, achieving higher decoding process speed, reducing required memory capacity and facilitating integration.

A second object of the present invention is to provide a Huffman code decoding circuit which permits selection of various decoding systems in consideration of speeding of the decoding process and downsizing of a memory.

A third object of the invention is to provide a Huffman code decoding circuit which can reduce a chip area in integration and lower a cost.

According to one aspect of the invention, a huffman code decoding circuit comprises:

decoding table storing means for storing a decoded word and a code length or a pointer to be accessed in the next time determined on the basis of a state transition upon decoding of a bit variable length code per every one or n bits, which n is an integer greater than or equal to two, and a flag representative of the decoding condition of the code and outputting the decoded word and the code length or the pointer for next access and the flag corresponding to an access address of m bits, which m is greater than n;

latching means for latching the pointer of m–1 bit output from the decoding table storing means when the flag is indicative of continuation of decoding, which latching means is reset when the flag output from the decoding table storing means is indicative of completion of decoding; and selecting means for selectively outputting n–1 bit from one of the latching means and the bit variable length code to the decoding table storing means, according to selection for decoding of the bit variable length code per every 1 bit or every n bit;

whereby the leading bit of the bit variable length code is input to the decoding table storing means as a least significant bit of the address, an upper m-n bits of the m–1 bit output from the latching means is input as the upper bit of the address, and n–1 bit output from the selecting means is input as a intermediate bit of the address.

In the preferred construction, the selecting means may comprise a selector for designating decoding of the bit variable length code per every one bit or per every n bits according to an external select signal.

Also, the latching means may be reset when the flag output from the decoding table storing means indicates completion of decoding and outputs "0" for m–1 bits.

According to another aspect of the invention, a Huffman code decoding circuit comprises:

internal decoding table storing means for storing a decoded word and a code length or a pointer to be accessed in the next time determined on the basis of a state transition upon decoding of a bit variable length code which is transmitted as a data sequence of h bits, the h being an integer, per every n bits, which n is an integer greater than or equal to one, and a flag representative of effectiveness in case of the decoded word and null in case of the pointer, and outputting the decoded word and the code length or the pointer for next access and the flag corresponding to an access address of m bits, which m is greater than n;

external decoding table storing means for storing a decoded word and a code length or a pointer to be accessed in the next time determined on the basis of a state transition upon decoding of the bit variable length code per every h bits, and outputting the decoded word and the code length or the pointer for next access and the flag corresponding to an access address less than or equal to h bits;

latching means for latching the pointer of m-n bit output from the decoding table storing means when the flag is indicative of null, which latching means is reset when the flag output from the decoding table storing means is indicative effectiveness;

first selecting means for selectively outputting m-n bits from one of the latching means and the bit variable length code depending upon number of bits of the n bits as a unit for decoding the bit variable length code;

second selecting means for selectively outputting effective decoded word among decoded words output from the internal decoding table storing means and the external decoding table storing means; and select signal generating mean for generating a signal to the second selecting means for selecting the decoded word output from the internal decoding table storing means when the flag output from the internal decoding table storing means is indicative of effectiveness and a signal to the second selecting means for selecting the decoded word output from the external decoding table storing means when the flag is indicative of null, whereby the leading n bits of the bit variable length code are input to the internal decoding table storing means as lower bits of the address and m-n bits output from the latching means are input as the upper bits of the address, and the h bits code is input to the external decoding table storing means as the address.

In the above-mentioned construction, the Huffman code decoding circuit may further comprise:

third selecting means for selectively outputting effective one of code length among code lengths output from the internal decoding table storing means and the external decoding table storing means, and wherein the select signal generating means generates a signal to the third selecting means for selecting the code length output from the internal decoding table storing means when the flag output from the internal decoding table storing means is indicative of effectiveness and a signal to the third selecting means for selecting the code length output from the external decoding table storing means when the flag is indicative of null.

According to a further aspect of the invention, a Huffman code decoding circuit comprises:

address generating means including means for detecting a pattern of a data sequence having $2^{(m+1)}$ bits or more for forming a Huffman code, which m is an integer, in which pattern, n bits from the leading bit to nth bit are logical "1" and n+1th bit is logical "0";

address deriving means for generating a plurality of addresses corresponding to a plurality of Huffman codes by adding m bits from n+2th bit to n+2+mth bit to $2^m \times (n+1)$ when the pattern is detected; and decoding table storing means for string decoded words and code lengths corresponding to the Huffman codes and outputting the decoded word and the code length corresponding to the address.

In this case, the pattern detecting means may generate the address by adding bits from p−1th bit to m+1th bit to $2^m \times (p-m-1)$ when the maximum code length of the Huffman code is p which is greater than or equal to m, and when the pattern of the data sequence has logical "1" for all bits from the leading bit to p−m−1th bit is According to a still further aspect of the invention, a Huffman code decoding circuit comprises:

address generating means including means for detecting a pattern of a data sequence having $2^{(m+1)}$ bits or more for forming a Huffman code, which m is an integer, in which pattern, n bits from the leading bit to nth bit are logical "1" and n+1th bit is logical "0";

address deriving means for generating a plurality of addresses corresponding to a plurality of Huffman codes by adding m bits from n+2th bit to n+2+mth bit to $2^m \times (n+1)$ when the pattern is detected;

code length outputting means for outputting the code length corresponding to the decoded word according to a predetermined code length distribution; and decoding table storing means for string decoded words corresponding to the Huffman codes and outputting the decoded word corresponding to the address.

The pattern detecting means may generate the address by adding bits from p−1th bit to m+1th bit to $2^m \times (p-m-1)$ when the maximum code length of the Huffman code is p which is greater than or equal to m, and when the pattern of the data sequence has logical "1" for all bits from the leading bit to p−m−1th bit is detected. Also, the code length outputting means may output the code length corresponding to the decoded word on the basis of the states of several bits from the leading bit of the Huffman code.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 2 is an explanatory illustration showing an example of setting of a memory in the first embodiment;

FIG. 3 is an explanatory illustration showing an example of setting of a memory in the first embodiment;

FIG. 4 is an explanatory illustration showing an example of setting of a memory in the first embodiment;

FIG. 6 is an explanatory illustration showing an example of setting of an internal memory in the second embodiment;

FIG. 7 is an explanatory illustration showing another example of setting of an internal memory in the second embodiment;

DESCRIPTION OF THE PREFERRED EMBODIMENT

Figure 1:
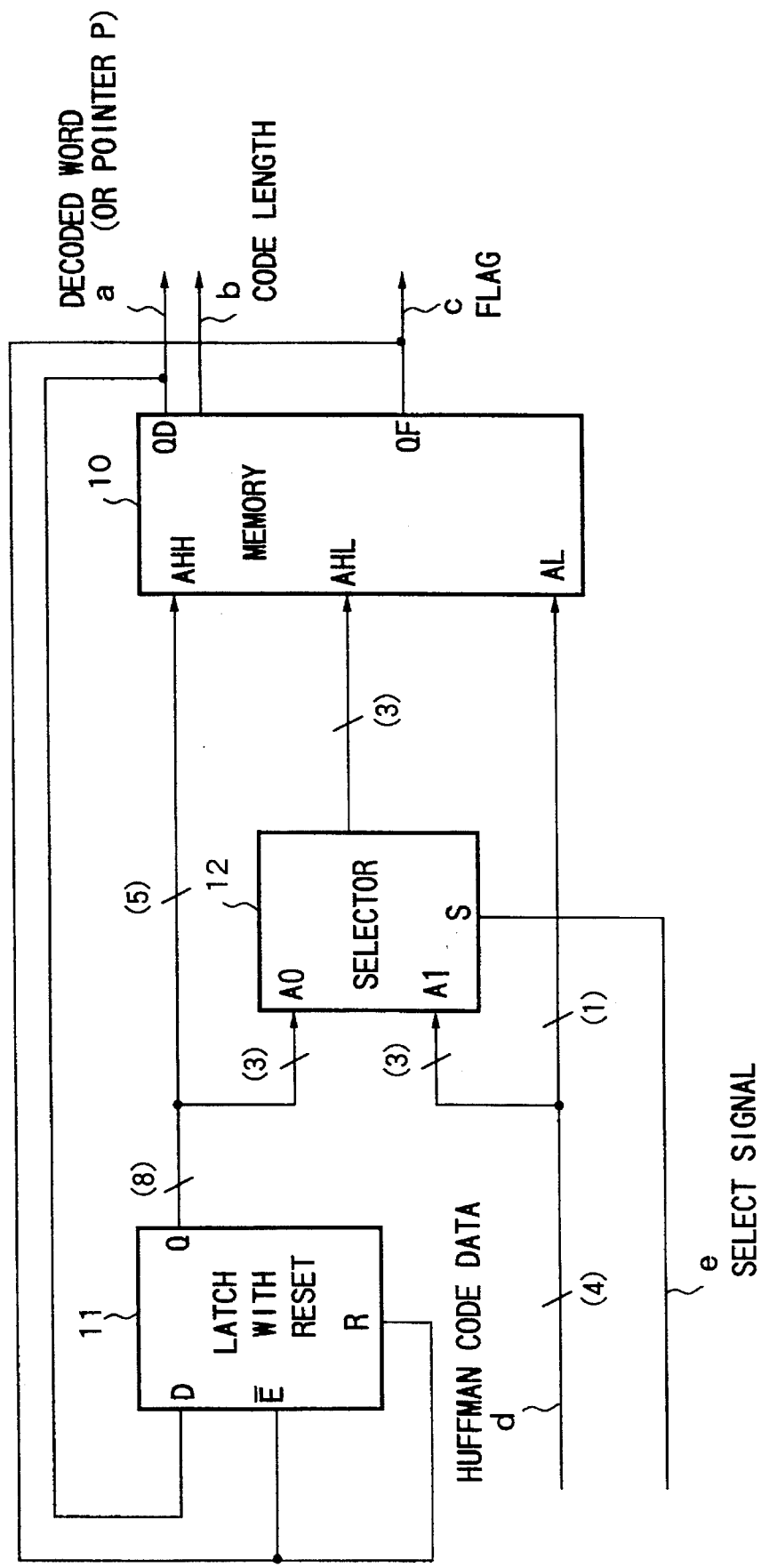
FIG. 1 is a block diagram of the first embodiment of a Huffman code decoding circuit according to the present invention.

The preferred embodiments of the present invention will be discussed with reference to FIGS. 1–7. Initially, discussion will be given for the first embodiment of a Huffman code decoding circuit with reference to FIG. 1. The first embodiment of the Huffman code decoding circuit, illustrated in FIG. 1, generally comprises a memory 10, a latch circuit 11 with a reset function and a selector 12.

The memory 10 has a construction of 512 W (word)×9 bits. This memory 10 has addresses of 9 bits. A leading 1 bit of a Huffman code data sequence d is input as the least significant bit (lowermost address AL). On the other hand, 3 bits of the output of the selector 12 is output as 4 bits from 2nd bit of an address (intermediate address AHL). Among 8 bits as the output of the latch circuit 11, upper 5 bits are input as upper 5 bits (upper address AHH).

The memory 10 expresses a decoded word a and a code length b or pointer p with 8 bits in 9 bits, and remaining 1 bit expresses a flag c.

From the output QD of the memory, the decoded word a (or the pointer p) and the code length b are output. From an output QF, the flag c is output. This flag c is indicative of decoding condition of the Huffman code. For example, when the decoded word a is derived from the output QD, the flag c is set to "1", and when the pointer p (next address of the memory 10) (during continuation of decoding process), the flag c is set to "0".

The latch circuit 11 with the reset function, latches 8 bits of the pointer p output from the memory 10 when the flag is "0". On the other hand, when the flag c is "1", the latch circuit 11 is reset to output a data having "0" in all 8 bits.

On the other hand, the selector 12 selects either input A0 or A1 on the basis of the select signal e to output to the intermediate address AHL. When decoding of the Huffman code data sequence d is to be performed per each bit, the input A0 is selected. In this case, the input A0 is selected by the select signal e. In this case, for the input A0 of the selector, the lower 3 bits among 8 bits of the output from the latch circuit 11 to the intermediate address AHL. On the other hand, when decoding of the Huffman code data sequence is to be performed per 4 bits of the Huffman code data, the input A1 is selected by the select signal e. In this case, to the input A1, the upper 3 bits of the Huffman code data sequence d is input to the intermediate address AHL of the memory 10.

FIGS. 2 and 3 show examples of setting of the memory 10 in FIG. 1. In FIG. 2, there is illustrated a setting in which "A" as the decoded word a, "4" as the code length b and "1" of the flag c corresponding to the Huffman code data sequence "0101" is set in the address "000001010". On the other hand, in FIG. 3, the pointer p and the flag c ("0") are set in the addresses "000001011" and "00001000", and "C" as the decoded word a, "10" as its code length b and "1" as the flag c corresponding to the Huffman code data sequence "1101000101" is set in the address "00010**10". It should be noted that, in the memory 1, the 9th bit indicates the flag (c).

Discussion for decoding process of the Huffman code data sequence per every 4 bits hereinafter. Namely, the input of the selector 12 is selected to the side of the input A1 by the selector signal e.

At first, it is assumed that the former decoding of the Huffman code d is completed, the latch circuit 11 is reset by the flag c="1", and the Huffman code "0101" corresponding to the decoded word "A" of FIG. 2 is provided as the next Huffman code d.

From the latch circuit 11, "0" is output for all 8 bits in response to resetting. Among this 8 bits, the upper 5 bits "00000" is input to an upper address AHH. On the other hand, the lower 3 bits are input to an input A0 terminal of the selector 12. In this case, however, since the input A1 side is selected by the select signal e, the lower 3 bits of the latch circuit 11 is ignored.

Next, the leading one bit of the 4th bit "0" of the Huffman code "0101" is input to the lowermost address AL of the memory 10. The 3rd bit to 1st bit of the Huffman code "101" is input to the intermediate address AHL of the memory 10 via the input A1 of the selector 12.

As a result, to the memory, an address "000001010" is input with the upper address AHH "00000", the intermediate address "101" and the lowermost address "0". Then, the decoded word "A", the code length "4" and the flag c "1" are output from the memory 10. Subsequently, the leading end of the next Huffman code data sequence arrives.

It is further assumed that, as the next Huffman code data sequence d, the Huffman code "1101000101" corresponding to the decoded word C illustrated in FIG. 3 is transmitted. From the latch circuit 11, "0" is output for all 8 bits in response to resetting. Among this 8 bits, the upper 5 bits "00000" is input to an upper address AHH. The 10th bit (leading bit) "1" of the Huffman code is input to the lowermost address AL of the memory 10. The 9th bit to 7th bit "101" of the Huffman code is input to the intermediate address AHL of the memory 10 via the input A1 of the selector 12. As a result, to the memory, an address "000001011" is input. Then, the pointer p "00001000" and the flag c "0" are output from the memory 10. Since this memory output is the pointer p, decoding process (tracking) is performed again on the basis of this pointer p and the next 4 bits of the Huffman code.

Next, the latch circuit 11 latches the pointer to output "00001000". Among this 10 bits, the upper 5 bits "00001" is input to an upper address AHH. The 6th bit (leading bit) "0" of the Huffman code is input to the lowermost address AL of the memory 10. The 5th bit to 3rd bit "001" of the Huffman code is input to the intermediate address AHL of the memory 10 via the input A1 of the selector 12. As a result, to the memory, an address "000011000" is input. Then, the pointer p "00010000" and the flag c "0" are output from the memory 10. Since this memory output is the pointer p, decoding process (tracking) is performed again on the basis of this pointer p and the next 4 bits of the Huffman code.

In the next process cycle, the latch circuit 11 latches the pointer to output "00010000". Among this 10 bits, the upper 5 bits "00010" is input to an upper address AHH. The 2nd bit (leading bit) "0" of the Huffman code is input to the lowermost address AL of the memory 10. 3 bits consisted of the 1st bit "1" of the Huffman code and leading two bits "*" of the next Huffman code are input to the intermediate address AHL of the memory 10 via the input A1 of the selector 12. As a result, to the memory, an address "00010**10" is input. Then, the decoded word "C", the code length "10" and the flag c "1" are output from the memory 10.

The foregoing two bits "**" are leading 2 bits of the next Huffman code, and thus can be either "0" or "1". Namely, in the memory 10, the decoded word "C", the code length "10" and the flag c "1" indicative of the decoded word output are set in all of the addresses "000100010", "000100110", "000101010" and "000101110".

By the flag c "1", the latch circuit 12 is reset. Then, the leading end of the next Huffman code data sequence d arrives.

FIG. 4 shows an example of setting of an internal memory when the Huffman code is decoded per each 1 bit. As shown in FIG. 4, , the decoded word "A" corresponding to the Huffman code "0101" is set in this case. The decoding process in the case that the Huffman code is decoded one by one for each bit will be discussed hereinafter. Namely, the input for the selector 12 is selected to the input A0 side by the selector signal e.

Initially, the former Huffman code decoding cycle is completed and then the latch circuit 11 is reset by the flag c "1". It is assumed that the Huffman code "0101" corresponding to the decoded word "A" arrives.

1 bit from the leading end of the Huffman code data sequence is fed to the memory 10. Then, the latch circuit 11 is reset to output "0" for all 8 bits.

Among this 8 bits as the output of the latch circuit 11, the upper 5 bits "00000" is input to an upper address AHH. On the other hand, the lower 3 bits "000" are input to the intermediate address AHL via the input A0 terminal of the selector 12. The leading one bit "0" of the Huffman code is input to the lowermost address AL of the memory 10. As a result, to the memory, an address "000000000" is input. Then, the pointer "00000001" corresponding to the address "000000000" and the flag c "0" indicative of the pointer output are output from the memory 10.

Next, the latch circuit 11 latches the above-mentioned pointer and outputs "00000001". Among this 8 bits as the output of the latch circuit 11, the upper 5 bits "00000" is input to an upper address AHH. On the other hand, the lower 3 bits "001" of the output of the latch circuit 11 are input to the intermediate address AHL via the input A0 terminal of the selector 12. The 2nd bit "1" from the leading end of the Huffman code is input to the lowermost address AL of the memory 10. As a result, to the memory, an address "000000011" is input. Then, the pointer "00000010" corresponding to the address "000000011" and the flag c "0" are output from the memory 10.

Next, the latch circuit 11 latches the abovementioned pointer and outputs "00000011". Among the output of the latch circuit 11, the upper 5 bits "00000" is input to an upper address AHH. On the other hand, the lower 3 bits "011" of the output of the latch circuit 11 are input to the intermediate address AHL via the input A0 terminal of the selector 12. The 2nd bit "1" from the leading end of the Huffman code is input to the lowermost address AL of the memory 10. As a result, to the memory, an address "000000111" is input. Then, the decoded word "A", the code length "4 " and the flag c "1" are output from the memory 10. By the flag "1", the latch circuit 11 is reset, and then the leading end of the next Huffman code data sequence arrives thereto. Subsequently, the similar decoding processes are repeated.

As set forth above, in the first embodiment, when decoding is to be performed for every 4 bits, the input A1 side of the selector 12 is selected by the selector signal e, and when decoding is to be performed for every 1 bit, the input A0 side of the selector 12 is selected by the selector signal e. Accordingly, an importance is given for the decoding speed, decoding for every 4 bits is selected in the memory 10. It should be noted, however, that when decoding for every 4 bits is to be performed, the decoding table becomes greater than that of decoding for every 1 bit in the extend of 8 times at the maximum to cause increasing of the cost. Accordingly, when an importance is given for the cost, a decoding tree per 1 bit is set in the memory 10 to perform decoding for every 1 bit.

Figure 5:
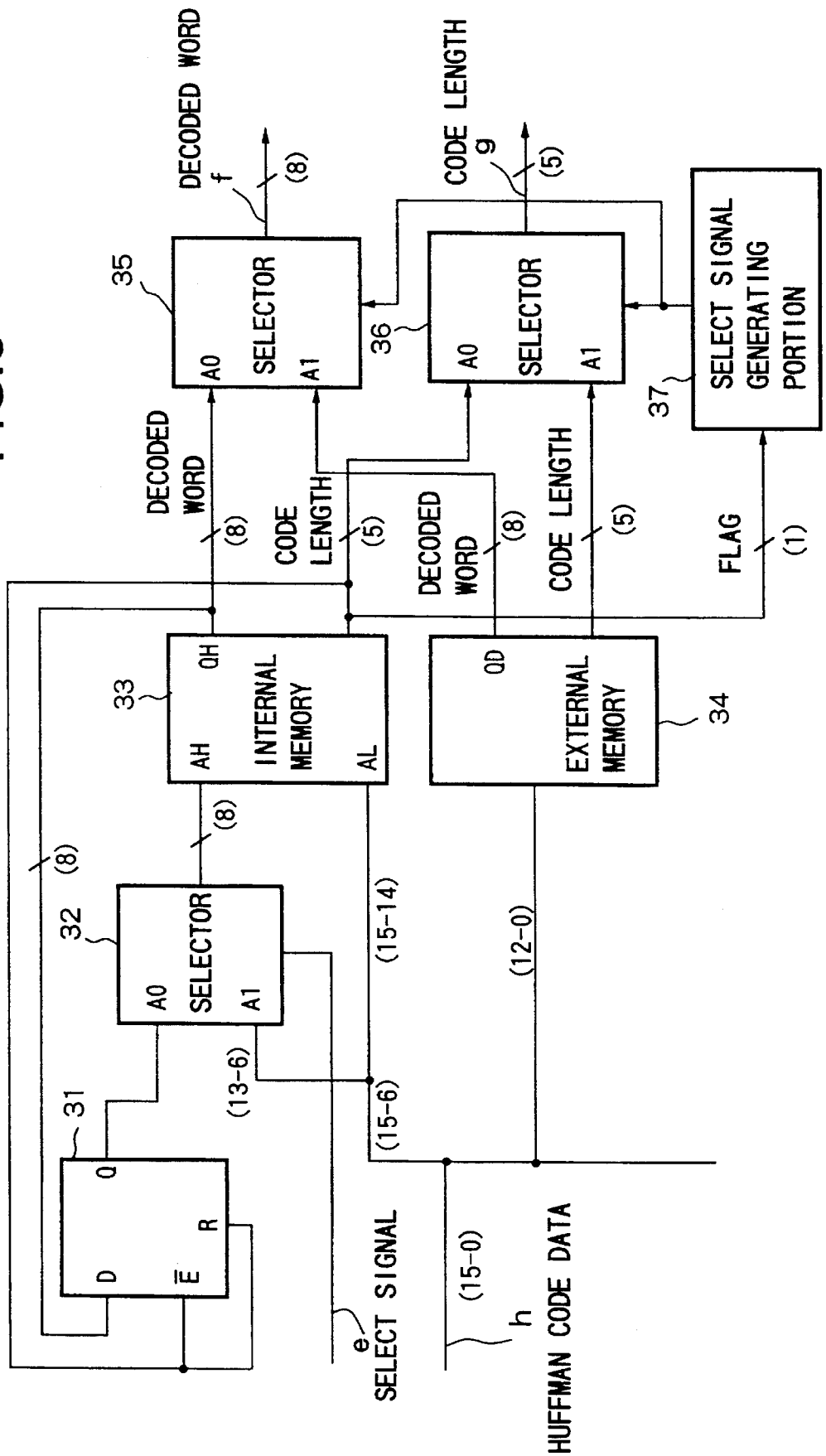
FIG. 5 is a block diagram of the second embodiment of a Huffman code decoding circuit according to the present invention.

The second embodiment of the Huffman code decoding circuit according to the present invention is illustrated in FIG. 5. The second embodiment of the Huffman code decoding circuit generally comprises a latch circuit 31 with a reset function, a selector 32, an internal memory 33, an external memory 34, a selector 35, a selector 36 and a select signal generating circuit 37. Here, the internal memory 33 is a memory provided in the same chip with the Huffman code decoding circuit, and the external memory 34 is a memory provided externally to the Huffman code decoding circuit.

The internal memory 33 has a construction of 1 kW (word)×13 bits. This internal memory 33 has addresses of 10 bits. A leading 2 bits of a Huffman code data sequence h of 16 bits are input as the lowermost address AL. On the other hand, 8 bits of the output of the selector 32 is output as 3rd to from 10th bits of the upper address AH.

The internal memory 33 expresses a decoded word a or pointer p with 8 bits among 13 bits, the code length b and the flag c with remaining 5 bits. From the output QD of the internal memory 33, the decoded word a (or the pointer p) is output. From an output QF, the code length b and flag c are output. This flag c indicates whether the output of the internal memory 33 is the decoded word (whether the output of the internal memory 33 is effective) or not. For instance, when the decoded word a is output from the output QD, the flag c is set to "1", and when the pointer p (next address of the memory 10) is output from the output QD (during continuation of decoding process), the flag c is set to "0".

The external memory 34 has a construction of 8 kW×13 bits. This external memory 34 has an address of 13 bits so that lower 13 bits of the 16 bits Huffman code data sequence h is input as the address. The external memory expresses the decoded word a with 8 bits in the 13 bits, and the code length b with the remaining 5 bits. From the output QD of the external memory 34, the decoded word a is output and from the output QFR, the code length b is output.

The latch circuit 31 with the reset function, latches 8 bits of the pointer p output from the internal memory 33 when the flag is "0". On the other hand, when the flag c is "1", the latch circuit 11 is reset to output a data having "0" in all 8 bits.

On the other hand, the selector 32 selects either input A0 or A1 on the basis of the select signal e to output to the upper address AH. When decoding of the Huffman code data sequence h is to be performed per every 2 bit, the input A0 is selected. In this case, the input A0 is selected by the select signal e. In this case, for the input A0 of the selector, the 8 bits of the output from the latch circuit 11 is input and then output to the upper address AH of the internal memory 33.

On the other hand, when decoding of the Huffman code data sequence is to be performed per number of bits other than 2 bits (e.g. per every 16 bits) of the Huffman code data, the input A1 is selected by the select signal e. In this case, to the input A1, 8 bits of the 13th to 6th bits of the Huffman code data sequence h is input and then output to the upper address AH of the internal memory 33.

The selector 35 selects output from the internal memory 33 or the output from the external memory 34 to output as the decoded word to output. The selector 36 selects the output of the internal memory 33 or the output from the external memory 34 to output as the code length to output.

The select signal generating circuit 37 outputs a select signal for selecting the output of the internal memory 33 to the selectors 35 and 36 when the outputs of the internal memory 33 are effective.

Here, in the internal memory 33 and the external memory 34, 8 bits of the decoded word and 5 bits of the code length are set. In addition, for the 5th bit of the 5 bits indicative of the code length in the internal memory 33 serves for setting and resetting the flag c. In the external memory 34, the decoded word and the code length corresponding to higher than and equal to 11th bit to and lower than or equal to 16th bit.

With the Huffman code decoding circuit constructed as set forth above, high speed decoding process can be performed by the internal memory 33 as long as the Huffman code length is less than or equal to 10 bits. When the decoding process speed is not significantly important, decoding is performed by tracking the decoding tree of each one bits. On the other hand, when high speed decoding process is desired irrespective of the cost, decoding process is performed by using the internal memory 33 and the external memory 34.

FIG. 6 shows an example of setting of the internal memory 33 in FIG. 5. With reference to FIG. 6, discussion will be given for the case where the code length of the Huffman code data sequence h is less than or equal to 10 bits and thus permits decoding process only by the internal memory 33.

Here, it is assumed that, as shown in FIG. 6, the decoded word "D" and the code length "6" corresponding to the Huffman code "010101" are set in the address "****101010" and the 16 bits Huffman code data sequence "010101 . . ." is received. In addition, in the shown example is directed to the decoding process for performing decoding process for the Huffman code data sequence h per every 16 bits. Therefore, the A1 side input of the selector 32 is selected by the selector signal e.

At this time, the latch circuit 31 is in the reset state. Therefore, "0" is output for all 8 bits from the latch circuit 31. Although the 8 bits from the latch circuit 31 is input to the A0 input of the selector 32, since the selector 32 is selected to the A1 input side, these 8 bits are ignored.

Next, the leading two bits (15th bit and 14th bit) "01" of the Huffman code data sequence h is input to the lower address AL of the internal memory 33. Namely, the leading bit (15th bit) becomes the least significant bit. The 8 bits from 13th bit to 6th bit of the Huffman code data sequence h are input to the upper address AH of the memory 10 via the input A1 of the selector 12. As a result, an address "**101010" is input to the internal address 33. It should be noted that "" is bits of the next Huffman code following to the Huffman code "010101" and can be either "0" or Then, the decoded word "D", the code length "6" and the flag c "1" corresponding to the address "**101010" are output from the internal memory 33. These data are fed to the selectors 35 and 36 respectively. In the shown case, by the flag c="1", effectiveness of the output of the internal memory 33 is notified to the select signal generating circuit 37. Then, from the select signal generating circuit 37, the select signal selecting the input A0 is fed to the selectors 35 and 36. As a result, through the selectors 35 and 36, the decoded word "D" and the code length "6" from the internal memory 33 are output. Among these, on the basis of the code length output from the selector 36, the leading end of the next Huffman code data sequence h is determined.

FIG. 7 shows another example of setting of the internal memory 33. The content of the internal memory 33 illustrated in FIG. 7 is an example for decoding the Huffman code per every 2 bits. It is assumed that the decoded word "B" and the code length "11" corresponding to the Huffman code "11111010001" is set in an address "00000101*1", and 16 bits Huffman code data sequence "11111010001 . . ." is received, as shown in FIG. 7. Since decoding process is to be performed for every 2 bits, input of the selector 32 is selected at the input A0 side by the selector signal e.

At this time, the latch circuit 31 is in the reset state. Therefore, "0" is output for all 8 bits from the latch circuit 31. This 8 bits from the latch circuit 31 is input to the upper address AH of the internal memory 33 via the A0 input of the selector 32. On the other hand, to the A1 input of the selector 32, 8 bits of the Huffman code is input. On the other hand, the leading two bits (15th bit and 14th bit) "11" of the Huffman code data sequence h is input to the lower address AL of the internal memory 33 with setting the leading bit (15th bit) at the least significant bit. Accordingly, an address "0000000011" is input to the internal address 33. Then, from the internal memory 33, the corresponding pointer "00000001" and the flag c="0" are output.

This 8 bits of pointer "00000001" is latched by the latch circuit 31 and output therefrom. Then, this 8 bits is input to the upper address AH of the internal memory 33 via the A0 input of the selector 32. Next, subsequent two bits (13th bit and 12th bit) "11" of the Huffman code data sequence h is input to the lower address AL of the internal memory 33. Accordingly, an address "0000000111" is input to the internal address 33. Then, from the internal memory 33, the corresponding pointer "00000010" and the flag c="0" are output.

This 8 bits of pointer "00000010" is latched by the latch circuit 31 and output therefrom. Then, this 8 bits is input to the upper address AH of the internal memory 33 via the A0 input of the selector 32. Subsequently, next two bits (11th bit and 10th bit) "10" of the Huffman code data sequence h is input to the lower address AL of the internal memory 33. Accordingly, an address "0000001001" is input to the internal address 33. Then, from the internal memory 33, the corresponding pointer "00000011" and the flag c="0" are output.

This 8 bits of pointer "00000011" is latched by the latch circuit 31 and output therefrom. Then, this 8 bits is input to the upper address AH of the internal memory 33 via the A0 input of the selector 32. Subsequently, next two bits (9th bit and 8th bit) "10" of the Huffman code data sequence h is input to the lower address AL of the internal memory 33. Accordingly, an address "0000001101" is input to the internal address 33. Then, from the internal memory 33, the corresponding pointer "00000100" and the flag c= "0" are output. This 8 bits of pointer "00000100" is latched by the latch circuit 31 and output therefrom. Then, this 8 bits is input to the upper address AH of the internal memory 33 via the A0 input of the selector 32. Subsequently, next two bits (7th bit and 6th bit) "00" of the Huffman code data sequence h is input to the lower address AL of the internal memory 33. Accordingly, an address "0000010000" is input to the internal address 33. Then, from the internal memory 33, the corresponding pointer "00000101" and the flag c="0" are output.

This 8 bits of pointer "00000101" is latched by the latch circuit 31 and output therefrom. Then, this 8 bits is input to the upper address AH of the internal memory 33 via the A0 input of the selector 32. Subsequently, next two bits (5th bit and 4th bit) "1*" of the Huffman code data sequence h is input to the lower address AL of the internal memory 33. "*" is the leading bit of the Huffman code following the Huffman code "11111010001" and can be either "0" or "1".

By this, an address "00000101*1" is input to the internal address 33. Then, from the internal memory 33, the decoded word "B" corresponding "00000101*1" and the flag c="1" are output. These data are fed to the selectors 35 and 36. Here, since the flag c is "1", effectiveness of the output of the internal memory 33 is notified to the select signal generating circuit 37. Therefore, the select signal generating circuit 37 outputs the select signal for selecting the A0 input to the selectors 35 and 36. As a result, from the selectors 35 and 36, the decoded word "B" and the code length "11" from the internal memory 33 are output. Among these, on the basis of the code length output from the selector 36, the leading end of the next transmitted Huffman code data sequence h is determined.

Next, discussion will be given for the case where decoding process is performed by using both of the internal memory 33 and the external memory 34.

Here, in the internal memory 33, the decoded words and the code lengths expressed by less than or equal to 10 bits of the 16 bits Huffman code data sequence h. Also, the flag c of the internal memory 33 is set at the 5th bit of the code length. In the external memory 34, the decoded words and the code length correspond to the Huffman code of more than or equal to 11 bits to less than or equal to 16 are set.

It should be appreciated that when the Huffman code is assigned in an order of the code length, the leading 3 bits of the Huffman codes having bits more than or equal to 11 bits always become "111". Therefore, the address input for the external memory 34 is input with excluding the leading 3 bits (15th~13th bits)

On the other hand, in the internal memory 33, the decoded word "D" and the code length "6" are set in all of addresses "****101010" (i.e. 8 addresses of "0000101010~01111010101" when the Huffman code is "010101", for example. On the other hand, in the external memory 34, the decoded word "B" and the code length "11" are set in all addresses from "1101000100000"~"1101000111111" when the Huffman code corresponding to the decoded word "B" is "11111010001", for example.

Here, consideration is given for the case where the 16 bits Huffman code data sequence "010101 . . . " is transmitted. The leading two bits (15th and 14th bits of the Huffman code data sequence) "01" are input to the lower address AL of the internal memory 33. On the other hand, 8 bits consisted of 13th to 10th bits of the Huffman code data sequence (i.e. the 3rd to 6th bits from the leading end of the Huffman code) "0101" and leading 4 bits of the next Huffman code "****" are input to the upper address AH of the internal memory 33 via the A1 input of the selector 32. When both of the internal memory 33 and the external memory 34 are used, the selector 32 is selected at the A1 input side by the select signal e.

Accordingly, in the internal memory 33, the address "****101010" is input. Then, the decoded word "D", the code length "6", and the flag c="1" corresponding to the address are output. By the flag c="1", the selector signal e indicative of the effectiveness of the internal memory 33 is output from the select signal generating circuit 37. On the other hand, the external memory 34 outputs the decoded word and the code length corresponding to 13 bits address input.

The decoded words and the code lengths obtained from the internal memory 33 and the external memory 34 are fed to the selectors 35 and 36. At this time, the select signal generating circuit 37 feeds the select signal e for selecting the output of the internal memory 33 to the selectors 35 and 36 in response to the flag c="1". The selectors 35 and 36 thus outputs the decoded word "D" and the code length "6". The code length "6" is fed to the Huffman code data sequence h for determining the leading end of the next Huffman code data sequence h.

Next, consideration is given for the case where the Huffman code data sequence "1111010001 . . . ". In the internal memory 33, the leading two bits "11" are input to the lower address AL, and 8 bits from leading 3rd bit to 10th bit (upper 13 bit~6 bit) "11101000" are input to the upper address AH via the A1 input of the selector 32. Accordingly, in the internal memory 33, an address "0001011111" is input. However, since the flag c is set at "0", null of the output of the internal memory 33 ia notified to the select signal generating circuit 37.

On the other hand, in the external memory 34, leading 4th to 16 bits (upper 12th bit to 0th bit) "***10001011" are input as an address. Then, the decoded word "B" and the code length "11" corresponding to "***10001011" are output from the external memory 34. In this case, the select signal e for making the output of the internal memory 33 null and for making the output of the external memory 34 effective, to the selectors 35 and 36. Thus, the selectors 35 and 36 are selected to the A1 input side. Therefore, from the selectors 35 and 36, the decoded word "B" and the code length "11" from the external memory 34 are output. The code length "11" is fed to the Huffman code data sequence h to determine the leading end of the next Huffman code data sequence h.

The third embodiment of the Huffman code decoding circuit according to the present invention will be discussed with reference to FIG. 8.

Figure 8:
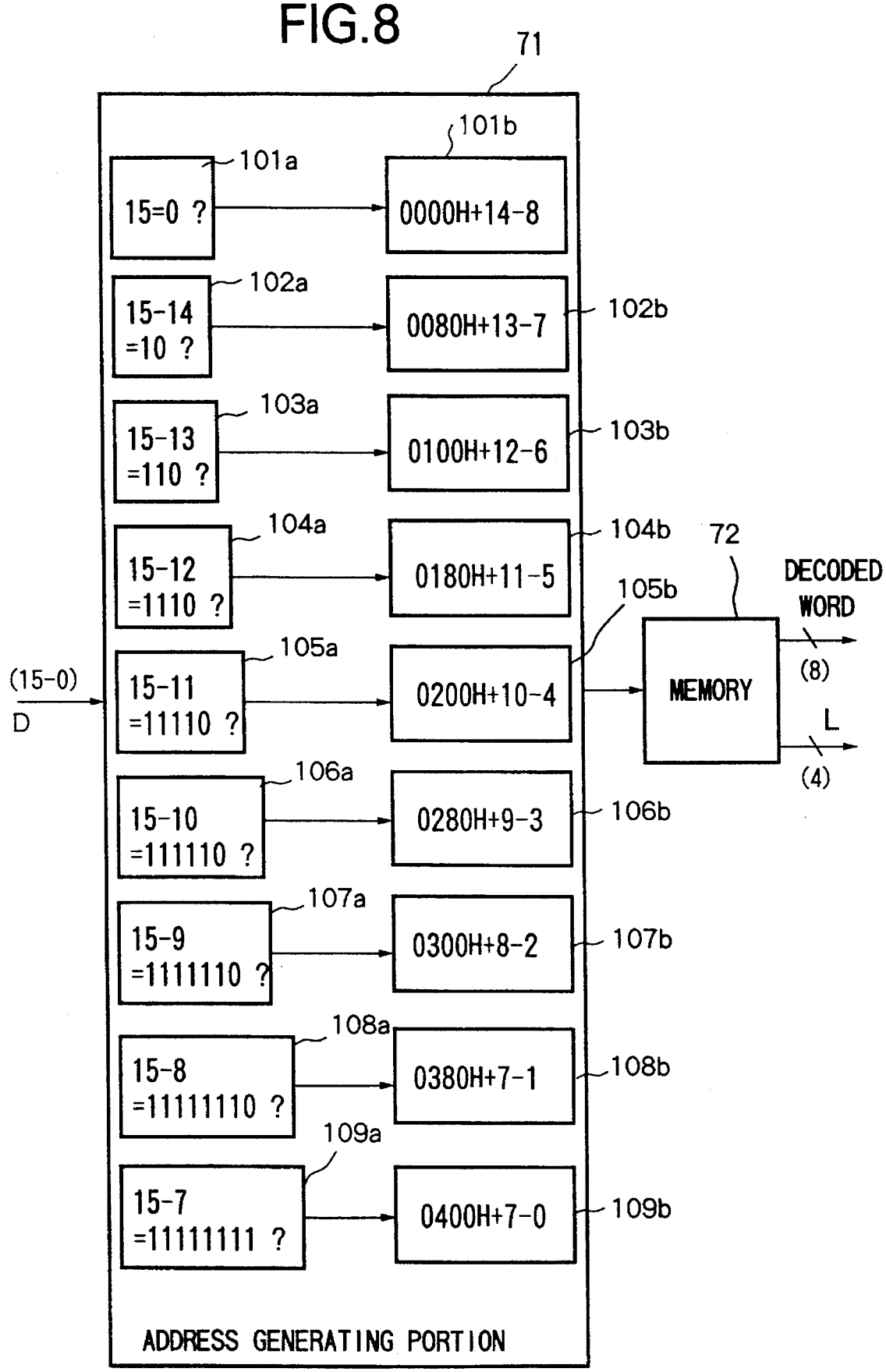
FIG. 8 is a block diagram of the third embodiment of a Huffman code decoding circuit according to the present invention.

As shown in FIG. 8, the third embodiment of the Huffman code decoding circuit comprises an address generating circuit 71 for detecting a predetermined code sequence pattern from the data sequence of the Huffman code and generating an address corresponding to the detected pattern, and a memory 72 for inputting the address output from the address generating circuit and outputting the decoded word and the code length corresponding to the address.

On the other hand, the address generating circuit 71 includes pattern detecting portions 101a~109a and address deriving portions 101b~109b.

This Huffman code decoding circuit uses the fact that number of bits following "0" is less than or equal to 7, when the number of word of the Huffman code is less than or equal to 256, and when "0" is present in the code data sequence.

Here, it is assumed that the maximum code length L of the Huffman code is 16 bits and the decoded word is 8 bits. The pattern detecting portion 101a of the address generating circuit 71 detects whether the leading bit of the Huffman code data sequence d, namely the 15th bit, is "0" or not with respect to the Huffman code data sequence d consisted of 15th to 0th bits with taking 15th bit as the leading bit. When the pattern detecting portion 101a detects "0" at the 16th bit, the address deriving portion 101b adds 7 bits of 14th bit to 8th bit to "0000(H)" to derive the address.

The pattern detecting portion 102a of the address generating circuit 71 detects whether the 15th bit is "1" and the second leading bit, i.e. 14th bit is "0". When the pattern detecting portion 102a detects that the 15th bit is "1" and the 14th bit is "0", the address deriving portion 102b adds 7 bits of 13th bit which is the third leading bit, to 7th bit to "0080(H)" to derive the address.

The pattern detecting portion 103a of the address generating circuit 71 detects whether leading two bits, i.e. the 15th and 14th bits are "1" and the 13th bit is "0". When the pattern detecting portion 103a detects that the 15th and 14th bits are "1" and the 13th bit is "0", the address deriving portion 103b adds 7 bits of 12th bit which is the fourth leading bit, to 6th bit to "0100(H)" to derive the address.

The pattern detecting portion 104a of the address generating circuit 71 detects whether leading three bits, i.e. the 15th~13th bits are "1" and the 12th bit is "0". When the pattern detecting portion 104a detects that the 15th~13th bits are "1" and the 12th bit is "0", the address deriving portion 104b adds 7 bits of 11th bit which is the fifth leading bit, to 5th bit to "0180(H)" to derive the address.

The pattern detecting portion 105a of the address generating circuit 71 detects whether leading four bits, i.e. the 15th~12th bits are "1" and the 11th bit is "0". When the pattern detecting portion 105a detects that the 15th~12th bits are "1" and the 11th bit is "0", the address deriving portion 105b adds 7 bits of 10th bit which is the sixth leading bit, to 4th bit to "0200(H)" to derive the address.

The pattern detecting portion 106a of the address generating circuit 71 detects whether leading five bits, i.e. the 15th~11th bits are "1" and the 10th bit is "0". When the pattern detecting portion 106a detects that the 15th~11th bits are "1" and the 10th bit is "0", the address deriving portion 106b adds 7 bits of 9th bit which is the seventh leading bit, to 3rd bit to "0280(H)" to derive the address.

The pattern detecting portion 107a of the address generating circuit 71 detects whether leading six bits, i.e. the 15th~10th bits are "1" and the 9th bit is "0". When the pattern detecting portion 107a detects that the 15th~10th bits are "1" and the 9th bit is "0", the address deriving portion 107b adds 7 bits of 9th bit which is the eighth leading bit, to 2nd bit to "0300(H)" to derive the address.

The pattern detecting portion 108a of the address generating circuit 71 detects whether leading seven bits, i.e. the 15th~9th bits are "1" and the 8th bit is "0". When the pattern detecting portion 108a detects that the 15th~9th bits are "1" and the 8th bit is "0", the address deriving portion 108b adds 7 bits of 7th bit which is the ninth leading bit, to 1st bit to "0380(H)" to derive the address.

The pattern detecting portion 109a of the address generating circuit 71 detects whether leading eight bits, i.e. the 15th~8th bits are "1" and the 7th bit is "0". When the pattern detecting portion 109a detects that the 15th~8th bits are "1" and the 7th bit is "0", the address deriving portion 109b adds 8 bits of 7th bit which is the ninth leading bit, to 0th bit to "0400(H)" to derive the address.

Here, in either case in adding 7 bits and 8 bits, summing operation is performed by replacing the lower 7 or 8 bits of the input Huffman code data to binary numbers as converted from hexa-decimal numbers "0000", "0080", "0100", "0180", "0200", "0280", "0300", "0380" and "0400".

In the memory 72, 8 bits of the decoded word and 4 bits of the code length L are set. Here, it is assumed that the Huffman code corresponding to the decoded word "A" is "0001". Accordingly, the decoded word "A" and the code length "47" are set forth all addresses "0000000000010000"~"0000000000011111".

Similarly, it is assumed that the Huffman code corresponding to the decoded word "B" is "11111010001". Accordingly, the decoded word "B" and the code length "11" are set forth all addresses "00000001011000100"~"00000001011000111. In the similar manner, addresses are set for the Huffman codes corresponding to respective decoded words. The concrete operation will be discussed hereinafter.

Initially, it is assumed that the Huffman code data sequence d input to the address generating circuit 71 is 16 bits of "0001 . . . ". The 15th bit as the leading bit is "0", it is detected by the pattern detecting portion 101a. Then, in the address deriving portion 101b, 7 bits of 14th to 8th bits is added to "0000(H)" to derive the address "001**" and output to the memory 72**.

As set forth above, all of the address of the memory 72 "0000000000010000"~"0000000000011111" are set with the decoded word "A" and the code length "4 ". The decoded word "A" and the code length "4" are output from the memory 72 corresponding to the above-mentioned address. By the code length "4", the leading end of the Huffman code data sequence h is determined so that 16 bits from the leading end is input to the address generating circuit 71.

Next, it is assumed that the Huffman code data sequence d input to the address generating circuit 71 is "11111010001 . . . ". Since the leading six bits is "111110", "1" in the 15th to 11th bits and "0" in the 10th bit are detected by the pattern detecting portion 106a. Then, in the address deriving portion, 7 bits of 9th~3rd bits "10001" are added to "0280(H)" and then output to the memory 72** as address.

As set forth above, the decoded word "C" and the code length L "11" are set for the addresses "00000001011000100"~"00000001011000111", the decoded word "C" and the code length "11" are output from the memory 72. By the code length "11", the leading end of the Huffman code data sequence h is determined so that 16 bits from the leading end is input to the address generating circuit 71. Subsequently, the similar manner of operations are repeated to perform decoding operation.

Figure 9:
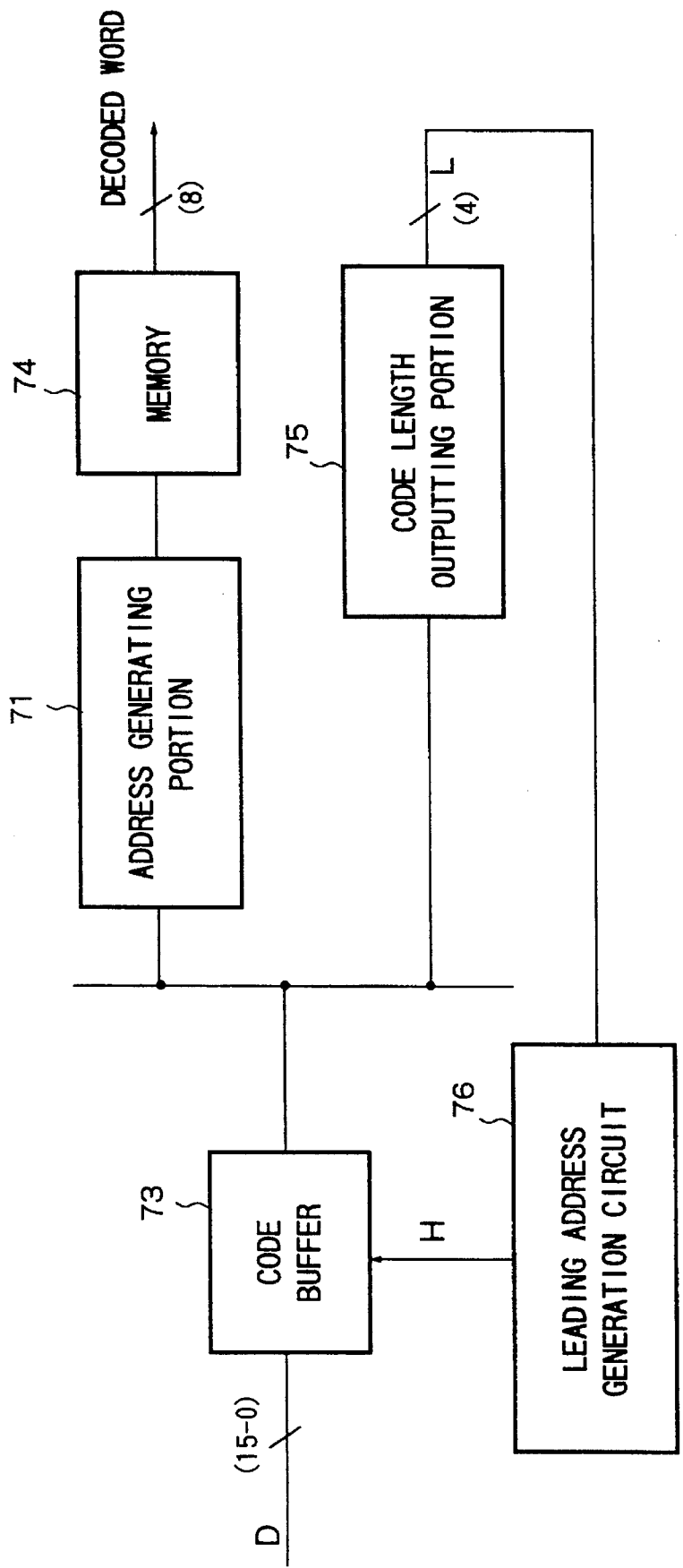
FIG. 9 is a block diagram of the fourth embodiment of a Huffman code decoding circuit according to the present invention.

Next, the fourth embodiment of the Huffman code decoding circuit according to the invention will be discussed with reference to FIG. 9.

The fourth embodiment of the Huffman code decoding circuit is constructed by adding a code buffer for temporarily holding the Huffman code data sequence d, a memory 74 in place of the memory 72 and having a capacity of 1280 W×8 bits, a code length outputting portion 75 and a leading address designating circuit 76 for designating the leading end of the Huffman code data sequence d, to the construction of the third embodiment set forth above.

Figure 10:
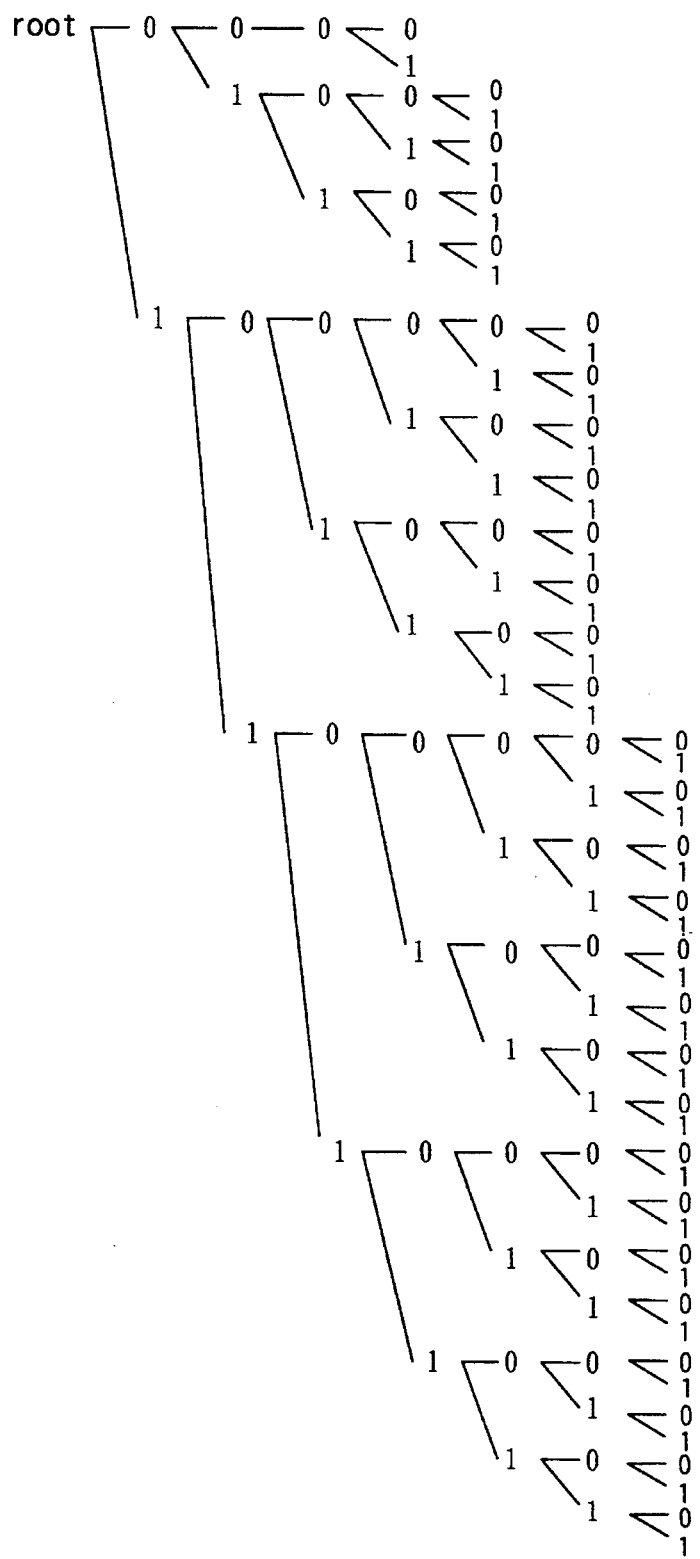
FIG. 10 is an illustration showing one example of distribution of code lengths of Huffman code.
Figure 11:
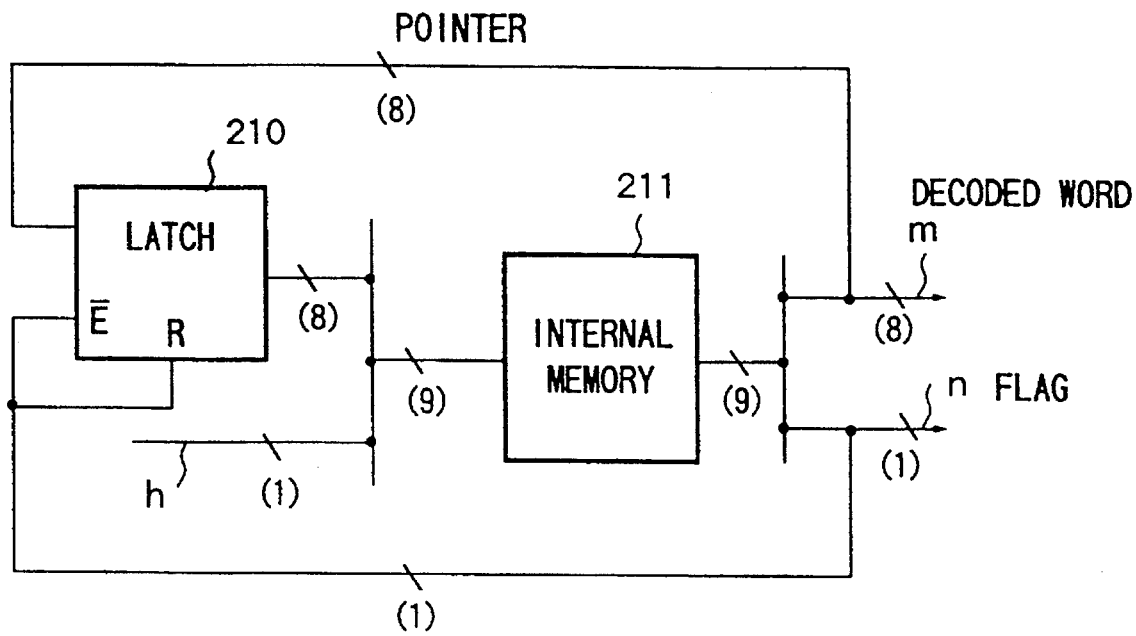
FIG. 11 is a block diagram of the first example of the conventional Huffman code decoding circuit.
Figure 12:
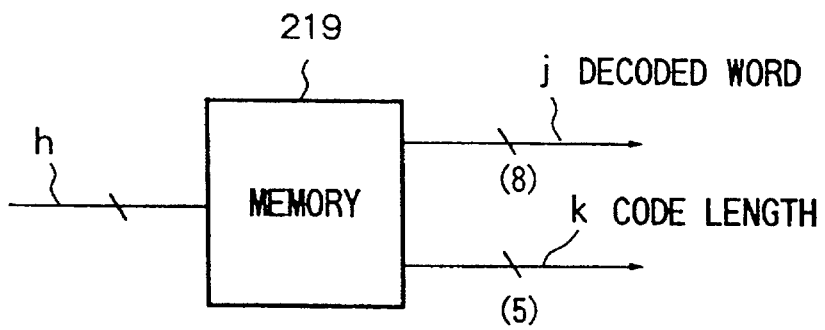
FIG. 12 is a block diagram of the second example of the conventional Huffman code decoding circuit.
Figure 13:
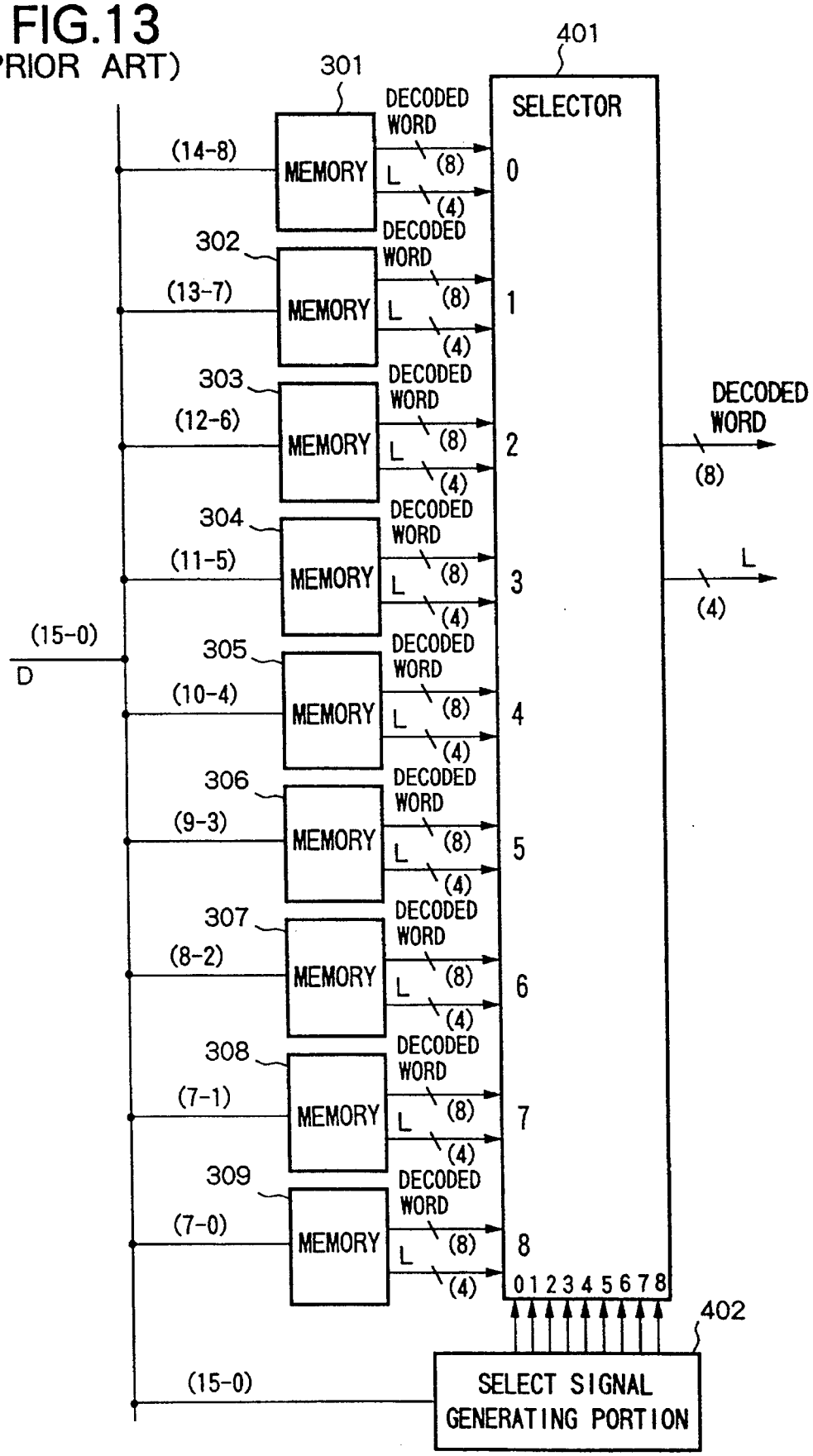
FIG. 13 is a block diagram of the third example of the conventional Huffman code decoding circuit.

On the other hand, FIG. 10 shows one example of distribution of the code length of the Huffman code data sequence d.

In the memory 74, the 8 bits decoded words are set. On the other hand, the code lengths are set in the code length outputting portion 5 so that the code length L of the decoded word is output in the basis of the code length distribution. Similarly to the above-mentioned embodiments, it is assumed that the Huffman code corresponding to the decoded word "A" is "0001". Accordingly, in the memory 74, the decoded word "A" is set for all addresses "0000000000010000"~"0000000000011111".

Form the code length distribution of FIG. 10, it can be derived that when the leading two bits of the Huffman code data sequence are "00", the code length L is "4", when the leading two bits are "01", the code length L is "5", when the leading two bits are "10", the code length L is "6", when the leading two bits are "11", the code length L is "7". In the code length outputting portion 75, the code lengths relative to the Huffman codes are set in accordance with this rule. Accordingly, when the input data sequence is "0001 . . . ", the code length "4" is output from the code length outputting portion 75 since the leading two bits are "00".

In the manner set forth above, the address and code length L of the Huffman codes relative to each decoded word are set.

For instance, assuming that the Huffman code data sequence d "0001 . . . " is input to the code buffer 73, the code buffer 73 accumulates the data sequence d and feed to the address generating circuit 71 and the code length outputting portion 75. In the address generating circuit 71, since the leading 15th bit is "0", the pattern detecting portion 101a of the address outputting portion 101 detects this to derive the address by adding 7 bits "001**" of 14th to 8th bits to "0000(H)" by the address deriving portion 101b, and to output to the memory 72. Therefore, the decoded word "A" and the code length L "4" corresponding to addresses "0000000000010000"~"0000000000011111" are output from the memory 72**.

At the same time, the since the input data sequence d "0001 . . . " is input to the code length outputting portion 75, as set forth above, and since the leading two bits are "00", the code length L "4" is output from the code length outputting portion 75.

The code length L "4" thus output is fed to the leading address designating circuit 76. The leading address designating circuit 76 makes judgement that the leading 4 bits of the Huffman code data sequence d accumulated in the code buffer 73 is the Huffman code corresponding to the decoded word "A" on the basis of the transmitted code length L "4", and then transmit a leading end designating signal H for designating that the leading 5th bit becomes the leading bit of the next Huffman code data sequence d. The code buffer 73 accumulates 16 bits from the bit designated by the transmitted leading end designating signal H as new Huffman code data sequence and feeds to the address generating circuit 71 and the code length outputting portion 75. By repeating the foregoing operation, decoding process can be performed.

In the above-mentioned fourth embodiment, since the code length is not output from the memory 74, it becomes possible to shorten the memory access time. Also, high speed determination of the leading bit of the Huffman code data sequence can be achieved without requiring expensive high speed memory.

In the third and fourth embodiments of the Huffman code decoding circuit, since required number of memory is one, it becomes possible to reduce the chip area in integration and can lower the cost.

Although examples are given for the cases where the number of words (number of codes) of the Huffman code is less than or equal to 256 in the third and fourth embodiments, the invention should not be specified to the shown embodiment. Namely, in case of the Huffman code consisted of a data sequence of $2^{(m+1)}$ (m is integer) bits or mote, a plurality of addresses are generate for a plurality of Huffman codes by detecting the pattern of the data sequence, in which the bits from the leading bit to the nth (n: integer) bit contain logical "1", and the n+1th bit contains logical "0", is detected by the pattern detecting portion, and by adding the data of m bits from n+2th bit to n+2+mth bit to $2^m \times (n+1)$ when the pattern is detected.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

For instance, in the foregoing third and fourth embodiment, it is possible to set the number of bits to be added in each address deriving portion to be 6 or less, e.g. 5, relative to the 16 bits of the Huffman code input to the address for reducing the memory capacity.

What is claimed is:

1. A huffman code decoding circuit comprising:

decoding table storing means for storing a decoded word and a code length or a pointer to be accessed in the next time determined on the basis of a state transition upon decoding of a bit variable length code per every one or n bits, where n is an integer greater than or equal to two, and a flag representative of the decoding condition of said code and outputting said decoded word and the code length or the pointer for next access and said flag corresponding to an access address of m bits, where m is greater than n;

latching means for latching said pointer of m−1 bit output from said decoding table storing means when said flag is indicative of continuation of decoding, which latching means is reset when said flag output from said decoding table storing means is indicative of completion of decoding; and selecting means for selectively outputting n−1 bit from one of said latching means and said bit variable length code to said decoding table storing means, according to selection for decoding of said bit variable length code per every 1 bit or every n bit;

whereby the leading bit of the bit variable length code is input to said decoding table storing means as a least significant bit of said address, an upper m-n bits of the m−1 bit output from said latching means is input as the upper bit of said address, and n−1 bit output from said selecting means is input as a intermediate bit of said address.

2. A Huffman code decoding circuit as set forth in claim 1, wherein said selecting means comprises a selector for designating decoding of said bit variable length code per every one bit or per every n bits according to an external select signal.

3. A Huffman code decoding circuit as set forth in claim 1, wherein said latching means is reset when the flag output from said decoding table storing means indicates completion of decoding and outputs "0" for m−1 bits.

4. A Huffman code decoding circuit comprising:

internal decoding table storing means for storing a decoded word and a code length or a pointer to be accessed in the next time determined on the basis of a state transition upon decoding of a bit variable length code which is transmitted as a data sequence of h bits, said h being an integer, per every n bits, where n is an integer greater than or equal to one, and a flag representative of effectiveness in case of said decoded word and null in case of said pointer, and outputting said decoded word and the code length or the pointer for next access and said flag corresponding to an access address of m bits, where m is greater than n;

external decoding table storing means for storing a decoded word and a code length or a pointer to be accessed in the next time determined on the basis of a state transition upon decoding of said bit variable length code per every h bits, and outputting said decoded word and the code length or the pointer for next access and said flag corresponding to an access address less than or equal to h bits;

latching means for latching said pointer of m-n bit output from said decoding table storing means when said flag is indicative of null, where latching means is reset when said flag output from said decoding table storing means is indicative of effectiveness;

first selecting means for selectively outputting m-n bits from one of said latching means and said bit variable length code depending upon number of bits of said n bits as a unit for decoding said bit variable length code;

second selecting means for selectively outputting effective decoded word among decoded words output from said internal decoding table storing means and said external decoding table storing means; and select signal generating means for generating a signal to said second selecting means for selecting the decoded word output from said internal decoding table storing means when said flag output from said internal decoding table storing means is indicative of effectiveness and a signal to said second selecting means for selecting the decoded word output from said external decoding table storing means when said flag is indicative of null, whereby the leading n bits of said bit variable length code are input to said internal decoding table storing means as lower bits of the address and m-n bits output from said latching means are input as the upper bits of the address, and the h bits code is input to said external decoding table storing means as the address.

5. A Huffman code decoding circuit as set forth in claim 4, which further comprises:

third selecting means for selectively outputting effective one of code length among code lengths output from said internal decoding table storing means and said external decoding table storing means, and wherein said select signal generating means generates a signal to said third selecting means for selecting the code length output from said internal decoding table storing means when said flag output from said internal decoding table storing means is indicative of effectiveness and a signal to said third selecting means for selecting the code length output from said external decoding table storing means when said flag is indicative of null.

6. A Huffman code decoding circuit comprising:

address generating means including means for detecting a pattern of a data sequence having $2^{(m+1)}$ bits or more for forming a Huffman code, where m is an integer, in which pattern, n bits from the leading bit to nth bit are logical "1" and n+1th bit is logical "0"; and address deriving means for generating a plurality of addresses corresponding to a plurality of Huffman codes by adding m bits from n+2th bit to n+2+mth bit to $2^m \times (n+1)$ when said pattern is detected; and decoding table storing means for storing decoded words and code lengths corresponding to said Huffman codes and outputting the decoded word and the code length corresponding to said address;

wherein said pattern detecting means generates the address by adding bits from p-1th bit to m+1th bit to $2^m \times (p-m-1)$ when the maximum code length of said Huffman code is p which is greater than or equal to m, and when the pattern of said data sequence has logical "1" for all bits from the leading bit to p-m-1th bit is detected.

7. A Huffman code decoding circuit comprising:

address generating means including means for detecting a pattern of a data sequence having $2^{(m+1)}$ bits or more for forming a Huffman code, where m is an integer, in which pattern, n bits from the leading bit to nth bit are logical "1" and n+1th bit is logical "0"; and address deriving means for generating a plurality of addresses corresponding to a plurality of Huffman codes by adding m bits from n+2th bit to n+2+mth bit to $2^m \times (n+1)$ when said pattern is detected;

code length outputting means for outputting the code length corresponding to said decoded word according to a predetermined code length distribution; and decoding table storing means for storing decoded words corresponding to said Huffman codes and outputting the decoded word corresponding to said address.

8. A Huffman code decoding circuit as set forth in claim 7, wherein said pattern detecting means generates the address by adding bits from p-1th bit to m+1th bit to $2^m \times (p-m-1)$ when the maximum code length of said Huffman code is p which is greater than or equal to m, and when the pattern of said data sequence has logical "1" for all bits from the leading bit to p-m-1th bit is detected.

9. A Huffman code detecting circuit as set forth in claim 7, wherein said code length outputting means outputs the code length corresponding to said decoded word on the basis of the states of several bits from the leading bit of said Huffman code.

10. A Huffman code detecting circuit as set forth in claim 7, which further comprises:

a code buffer means for temporarily holding the Huffman code data sequence, and a leading address designating means for designating the leading end of the next Huffman code data sequence accumulated in said code buffer means on the basis of the code length output from said code length outputting means.

* * * * *

UNITED STATES PATENT AND TRADEMARK OFFICE
CERTIFICATE OF CORRECTION

PATENT NO.   : 5,467,088
DATED        : November 14, 1995
INVENTOR(S)  : Shigenori KINOUCHI and Akira SAWADA It is certified that error(s) appears in the above-identified patent and that said Letters Patent is hereby corrected as shown below:

Col. 5, line 38, after "is" insert --detected.--.

Signed and Sealed this

Twenty-eighth Day of May, 1996

Attest:

BRUCE LEHMAN

Attesting Officer            Commissioner of Patents and Trademarks